US007242459B2

(12) United States Patent
Shi et al.

(10) Patent No.: US 7,242,459 B2
(45) Date of Patent: Jul. 10, 2007

(54) METHOD OF PREDICTING AND MINIMIZING MODEL OPC DEVIATION DUE TO MIX/MATCH OF EXPOSURE TOOLS USING A CALIBRATED EIGEN DECOMPOSITION MODEL

(75) Inventors: Xuelong Shi, San Jose, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 111 days.

(21) Appl. No.: 11/044,711

(22) Filed: Jan. 28, 2005

(65) Prior Publication Data

US 2005/0179886 A1 Aug. 18, 2005

Related U.S. Application Data

(60) Provisional application No. 60/539,997, filed on Jan. 30, 2004.

(51) Int. Cl.
*G03B 27/32* (2006.01)

(52) U.S. Cl. .......................... 355/77; 355/53; 716/19; 716/21; 430/311

(58) Field of Classification Search ................ 355/53, 355/69, 77; 716/19–21
See application file for complete search history.

(56) References Cited

U.S. PATENT DOCUMENTS

| 4,894,790 A | 1/1990 | Yotsuya et al. |
| 5,097,138 A | 3/1992 | Wakabayashi et al. |
| 5,307,296 A | 4/1994 | Uchida et al. |
| 5,307,421 A | 4/1994 | Darboux et al. |

(Continued)

FOREIGN PATENT DOCUMENTS

DE 410006262 A1 2/2004

(Continued)

OTHER PUBLICATIONS

Mack, et al. "Metrology, Inspection, and Process Control for Microlithography XV." Proceedings of SPIE, Feb. 26, 2001-Mar. 1, 2001, pp. 377-384, vol. 4344, The International Society for Optical Engineering, XP 008022568.

(Continued)

*Primary Examiner*—D. Rutledge
(74) *Attorney, Agent, or Firm*—McDermott Will & Emery LLP

(57) ABSTRACT

A method for generating models for simulating the imaging performance of a plurality of exposure tools. The method includes the steps of: generating a calibrated model for a first exposure tool capable of estimating an image to be produced by the first exposure tool for a given photolithography process, where the calibrated model includes a first set of basis functions; generating a model of a second exposure tool capable of estimating an image to be produced by the second exposure tool for the photolithography process, where the model includes a second set of basis functions; and representing the second set of basis functions as a linear combination of the first set of basis functions so as to generate an equivalent model function corresponding to the second exposure tool, where the equivalent model function produces a simulated image corresponding to the image generated by the second exposure tool for the photolithography process.

15 Claims, 6 Drawing Sheets

U.S. PATENT DOCUMENTS

| | | | |
|---|---|---|---|
| 5,319,564 | A | 6/1994 | Smayling et al. |
| 5,416,729 | A | 5/1995 | Leon et al. |
| 5,621,652 | A | 4/1997 | Eakin |
| 5,795,688 | A | 8/1998 | Burdorf et al. |
| 5,825,647 | A | 10/1998 | Tsudaka |
| 5,966,312 | A | 10/1999 | Chen |
| 6,081,659 | A | 6/2000 | Garza et al. |
| 6,289,499 | B1 | 9/2001 | Rieger et al. |
| 6,370,679 | B1* | 4/2002 | Chang et al. ............ 716/19 |
| 6,777,147 | B1* | 8/2004 | Fonseca et al. ............ 430/30 |
| 6,924,879 | B2* | 8/2005 | Ikeda ............ 355/53 |
| 2003/0126581 | A1 | 7/2003 | Pang et al. |
| 2005/0122500 | A1* | 6/2005 | Ye et al. ............ 355/67 |

FOREIGN PATENT DOCUMENTS

WO     WO 93/13432     7/1993

OTHER PUBLICATIONS

Cobb, et al. "Mathematical and CAD Framework for Proximity Correction." Optical Microlithography IX, Mar. 13-15, 1996, pp. 208-222, vol. 2726, SPIE, XP008022569.

Crisalle, et al. "A Comparison of the Optical Projection Lithography Simulators in SAMPLE and PROLITH." IEEE Transactions on Semiconductor Manufacturing, Feb. 1992, pp. 14-26, vol. 5, No. 1, IEEE.

Gopalarao, et al. "An Integrated Technology CAD System for Process and Device Designers." IEEE Transactions on Very Large Scale Integration (VLSI) Systems, Dec. 1993, pp. 482-490, vol. 1, No. 4, IEEE.

Neubauer, et al. "Imaging VLSI Cross Sections by Atomic Force Microscopy." 1992, pp. 299-303, IEEE/IRPS.

Rodgers. "Application of the Atomic Force Microscope to Integrated Circuit Reliability and Failure Analysis." 1991, pp. 250-254, IEEE/IRPS.

Qian, et al. "A New Scalar Planewave Model for High NA Lithography Simulations." 1994, pp. 45-48, IEEE.

Barouch, et al. "Modeling Process Latitude in UV Projection Lithography." IEEE Electron Device Letters, Oct. 1991, pp. 513-514, vol. 12, No. 10, IEEE.

Beacham, et al. "Applications of an Atomic Force Metrology System in Semiconductor Manufacturing." SPIE, pp. 311-321, vol. 1926.

"AFMs: What Will Their Role Be?" Semiconductor International, Aug. 1993, pp. 62-68.

Prolith/2 User's Manual, Finie Technologies, 1990-1993, Version 3.0 for the Macintosh.

Pati, et al., "Exploiting Structure in Fast Aerial Image Computation for Integrated Circuit Patterns," IEEE Transactions on Semiconductor Manufacturing, Feb. 1997, vol. 10, No. 1.

Australian Examination Report and Search Report Issued in corresponding Australian Patent Application No. SG 200500540-0, dated Jan. 31, 2005.

* cited by examiner

METHOD OF PREDICTING AND MINIMIZING MODEL OPC DEVIATION DUE TO MIX/MATCH OF EXPOSURE TOOLS USING A CALIBRATED EIGEN DECOMPOSITION MODEL

This application claims the benefit of provisional application 60/539,997, filed on Jan. 30, 2004 and titled Method Of Predicting And Minimizing Model OPC Deviation Due To Mix/Match Of Exposure Tools Using A Calibrated Eigen Decomposition Model, which is herein incorporated by reference in its entirety.

TECHNICAL FIELD OF THE INVENTION

The field of the invention relates generally to a method, apparatus and program for utilizing models to simulate the aerial image resulting from a target mask pattern imaged by a given process, and more particularly relates to a method, apparatus and program product for allowing a model, which is calibrated utilizing a first exposure tool, to be utilized to predict the imaging results of a second exposure tool without having to recalibrate the model.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As is known, optical proximity correction (OPC) features may be incorporated into the mask design to enhance the resulting image such that it more accurately represents the target pattern. Further, it is also known to utilize models of the desired process to simulate the aerial image of a given target pattern. Such models allow the operator to review the effects of adjusting masking features and OPC features on the resulting image without having to actually image a wafer, thereby saving both significant cost and time in the design process. One such modeling method is described in U.S. patent application Ser. No. 10/981,750, filed on Nov. 5, 2004, which is hereby incorporated by reference in its entirety.

Another goal in photolithography is to be able to utilize the same "process" for imaging a given pattern with different lithography systems (e.g., scanners) without having to expend considerable amounts of time and resources determining the necessary settings of each lithography system to achieve optimal/acceptable imaging performance. As is known, designers/engineers spend a considerable amount of time and money determining the optimal settings of a lithography system, which include numerical aperture (NA), $\sigma_{in}$, $\sigma_{out}$, etc., when initially setting up a given process to work with a particular scanner so that the resulting image satisfies the design requirements and process robustness requirements. Indeed, finding an optimal photolithography process condition for each layer involves enormous effort from the engineering side trough simulations and experiments. A method for allowing a given process to be utilized with different lithography systems is disclosed in U.S. patent application Ser. No. 10/926,400 filed on Aug. 26, 2004, which is hereby incorporated by reference herein in its entirety.

As noted above, target patterns are typically subjected to a simulation process using a calibrated model of the photolithography process so as to allow the designer to optimize the mask pattern such that the resulting image matches the target pattern within a defined tolerance. The model used in such data manipulation, which is commonly referred as to model OPC, is typically calibrated on a specific exposure tool under specific exposure conditions. However, as noted above, it is not uncommon for a photolithography process to be exported onto other exposure tools of the same class, in order to satisfy the high volume production requirements in a manufacturing environment. As such, it is highly desirable to be able to utilize the model calibrated on a first exposure tool on another exposure tool, without having to perform another complete calibration process, which is both expensive and time consuming. Currently, there is no known method for allowing a model calibrated on a first exposure tool to be utilized with another exposure tool without performing a complete calibration process on the other exposure tool.

SUMMARY OF THE INVENTION

It is an object of the present invention to address the foregoing deficiency in the prior art. To summarize, the present invention relates to a method and apparatus that allows a model calibrated on a first exposure tool to be utilized to generate a second model for simulating the imaging performance of a second exposure tool, without having to perform a calibration process for the second model utilizing the second exposure tool.

More specifically, the present invention relates to a method for generating models for simulating the imaging performance of a plurality of exposure tools. The method includes the steps of: generating a calibrated model for a first exposure tool capable of estimating an image to be produced by the first exposure tool for a given photolithography process, where the calibrated model includes a first set of basis functions; generating a model of a second exposure tool capable of estimating an image to be produced by the second exposure tool for the photolithography process, where the model includes a second set of basis functions; and representing the second set of basis functions as a linear combination of the first set of basis functions so as to generate an equivalent model function corresponding to the second exposure tool, where the equivalent model function produces a simulated image corresponding to the image generated by the second exposure tool for the photolithography process.

The present invention provides significant advantages over prior art methods. Most importantly, the present invention is very cost effective as it allows a previously calibrated model to be utilized in conjunction with other exposure tools without having to perform a calibration process on the other exposure tools.

Another advantage of the present invention is that by using a calibrated model which has been modified for use with the other exposure tools, it is possible to perform testing/simulation of the entire chip, as opposed to only limited testing which would be the case if direct experimental tests were conducted on the other exposure tools.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

The accompanying drawings, which are incorporated in and form a part of the specification, together with the description serve to explain the principles of the invention. In the drawings.

DETAILED DESCRIPTION OF THE INVENTION

Figure 1:
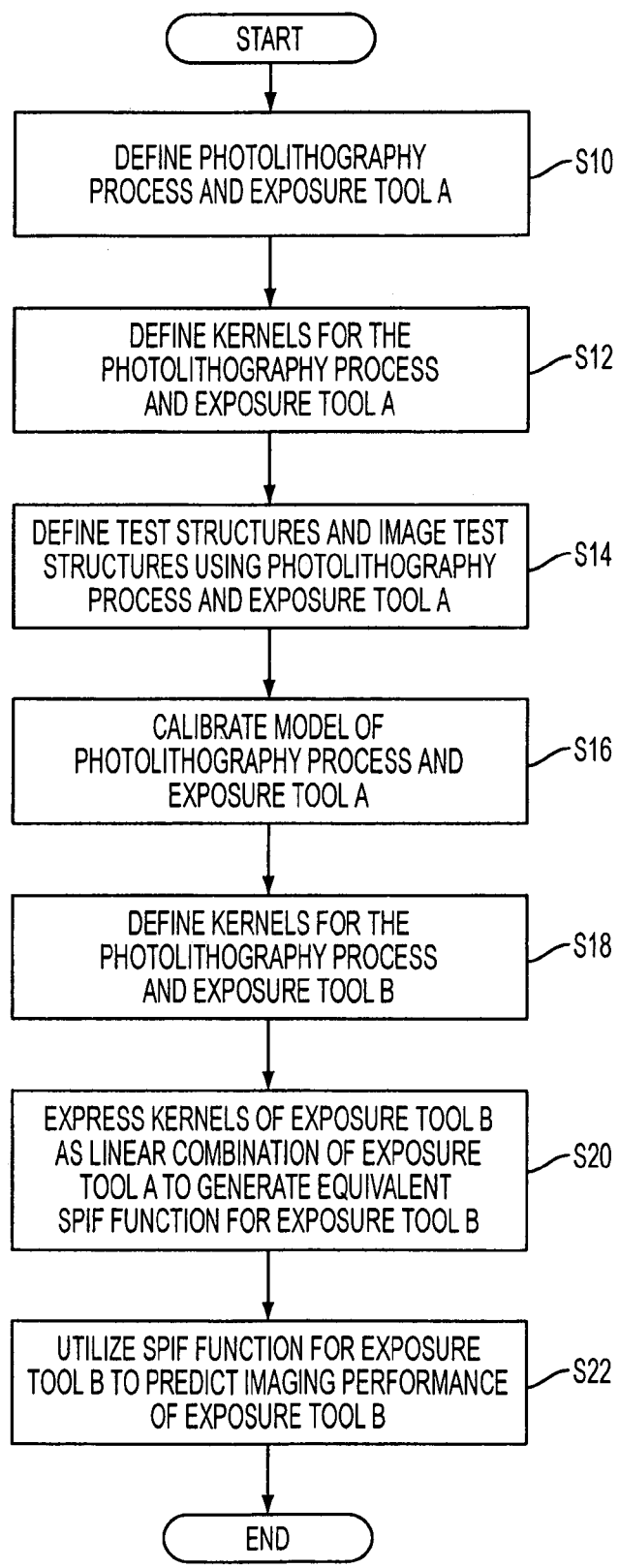
FIG. 1 is an exemplary flowchart illustrating the method of the present invention.

Disclosed herein is a method and apparatus for allowing a model, which is calibrated in conjunction with a first exposure tool and is capable of simulating the imaging performance of the first exposure tool, to be utilized to generate a second model capable of simulating the imaging performance of a second exposure tool without having to perform a calibration of the second model and second exposure tool. It is noted that the exemplary method detailed below utilizes an eigen function decomposition model (referred to as an Eigen Decomposition Model, or EDM), for modeling the performance of the imaging process. However, it is also possible to utilize the methods of the present invention with other types of models.

Prior to discussing the method of the present invention, a brief discussion regarding the generation of an eigen decomposition model is presented. A more detailed description of the generation of the eigen decomposition model can be found in U.S. patent application Ser. No. 10/981,750 filed on Nov. 5, 2004, as noted above.

As noted, in the following example illustrating the method of the present invention, a constant threshold eigen decomposition model is utilized. A constant threshold eigen decomposition model is premised on several fundamental theorems. The first is that any 2D binary image can be obtained by cutting a band limited real valued function at a constant threshold. The second is that the aerial image from an optical image system is a band limited function, and therefore, the effective degrees of freedom of the aerial image are finite. The third is that the optimal basis functions for describing the aerial image are the eigen functions, which can be solved utilizing an integral equation whose operator is determined by the optical image system setting.

Under partial coherent illumination conditions that are typically used in semiconductor manufacturing, the optical imaging system itself is nonlinear in character. The aerial image, i.e. the light intensity distribution at the image plane, from any given mask pattern, can be readily calculated rather accurately using well-known formulas in optics, see for example, H. H. Hopkins, Proc. Roy. Soc., A, 217 (1953), 408, herein incorporated by reference. The response of chemically amplified resist to light intensity and the subsequent resist development in solvent are all very nonlinear. The final developed pattern on a wafer can be viewed as binary, either with resist or without resist on top of the wafer substrate. The main function of the model is to provide a mathematical formula that can predict the binary image on the wafer from the mask pattern or the aerial image accurately. Stated mathematically, $$T(x,y)=F(M(x,y)) \quad (1)$$

where $T(x,y)$ is the produced binary image on the wafer, and $M(x,y)$ is the input pattern on the mask (which can include OPC features). F represents the unknown functional form, which is the core of any model. In the simplest constant threshold model, the binary image is achieved by cutting the aerial image of $M(x,y)$ using a constant threshold. It is noted that the binary image obtained by cutting the aerial image at a constant threshold does not typically fully agree with the experimental result due to the finiteness of the resist contrast. The simplicity in obtaining the binary image using a constant threshold, however, is very attractive. There exists a mathematical theorem which states any binary function $T(x,y)$, whose value is either 0 or 1, can be obtained by thresholding a band-limited continuous function $F(x,y)$ to any specified accuracy. The higher the required accuracy, the larger the required bandwidth of the function $F(x,y)$. Such a continuous function $F(x,y)$ is termed a system pseudo intensity function (SPIF) in the model of the present invention.

In other words, in the eigen decomposition model the object is to identify a transformation function that relates the aerial image to another band limited non-negative real valued function from which a desired binary image can be achieved by thresholding the non-negative real value function at certain value. The new band limited non-negative real valued function is referred to as a system pseudo intensity function (SPIF).

The transformation from the aerial image $I(x,y)$, which can be readily calculated, to SPIF constitutes a key element in the model. The value of SPIF at location $(x,y)$ depends not only on the value of aerial image intensity at $(x,y)$, but also on all the values of the aerial image intensity around point $(x,y)$. Mathematically, the SPIF can be expressed as:

$$SPIF(x,y)=G(I(x,y)) \quad (2).$$

Due to the complicated nature of the photolithography process, it is unlikely to derive an exact functional form of G based on first physical principles. As such, an approximate functional form of G is utilized. This is possible only if the aerial image $I(x,y)$ has finite effective degrees of freedom, which is true according to Shanon's sampling theorem, since the aerial image $I(x,y)$ is a band-limited function, as discussed in C. E. Shannon, Proc. IRE, 37, (1946), 429, herein incorporated by reference.

This transformation is not a point-to-point transformation. In other words, as stated above, the SPIF value at $(x,y)$ is not only dependent on the aerial image value at $(x,y)$, but also all values of the aerial image around $(x,y)$. It becomes apparent that a method of describing the aerial image intensity distribution around $(x,y)$ is required. It turns out that the effective degrees of freedom of the aerial image is finite according to Shannon's sample theorem, as discussed in C. E. Shannon, Proc. IRE, 37, (1946), 429, herein incorporated by reference, since the aerial image is a band limited function.

It has also been proven that there exists an optimal set of basis functions to decompose the aerial image that is produced from an optical imaging system at a specific imaging setting. In other words, the aerial image is calculated by the convolution of the mask function $M(x,y)$ with the eigen functions. More particularly, with an orthonormal set of functions $\{\phi_i\}$, the aerial image can be calculated using the following equation:

$$I(x, y) = \sum_{i=1}^{\infty} \alpha_i |\phi_i \otimes M|^2 \qquad (3)$$

where $\{\phi_i\}$ constitute a complete set of orthonormal functions, $\{\alpha_i\}$ are the corresponding weight factors, represents the convolution operation between the orthonormal function $\{\phi_i\}$ and the mask transmission function M. In the language of imaging theory, equation (3) shows that a partially coherent imaging system can be decomposed into a series of coherent imaging systems. Although there are other methods to decompose a partially coherent imaging system into a series of coherent imaging systems, the method described above has been proven to be an optimal one, often called optimal coherent decomposition. See, for example, Y. C. Pati and T. Kailath, J. Opt. Soc. Am. A 11, (1994), 2438, herein incorporated by reference.

Continuing, both $\{\phi_i\}$ and $\{\alpha_i\}$ can be obtained by solving the following integral equation, $$\iint W(x_1', y_1'; x_2', y_2') \phi_i(x_2', y_2') dx_2' dy_2' = \alpha_i \phi_i(x_1', y_1') \qquad (4)$$

and $$W(x_1', y_1'; x_2', y_2') = \gamma(x_2'-x_1', y_2'-y_1') K(x_1', y_1') K^*(x_2', y_2') \qquad (5)$$

where $\gamma(x_2'-x_1', y_2'-y_1')$ is the mutual coherence between $(x_1', y_1')$ and $(x_2', y_2')$ at the object plane, which is determined by illumination, and $K(x_1', y_1')$ is the impulse response function of the optical imaging system, which is determined by the pupil function of the optical system. More specifically, it is the complex amplitude at the point $(x_1', y_1')$ in the image plane, due to a disturbance of unit amplitude and zero phase at $(0, 0)$ in the object plane.

Under the illumination conditions commonly employed in semiconductor manufacturing, $\{\alpha_i\}$ drops rapidly with its index (i.e., $\alpha_1 \geq \alpha_2 \geq \alpha_3 \geq \ldots \geq \alpha_N \ldots$, and usually when N around 7, the ($\alpha_N$ is very small, close to zero), and only few terms are necessary to approximate the aerial image accurately. The contributions from other terms can be disregarded in the presence of noise that typically exists in a real optical imaging process. With this observation, one can assume only the first N terms are important, and equation (3) becomes:

$$I(x, y) = \sum_{i=1}^{i=N} \alpha_i |\phi_i \otimes M|^2 \qquad (6)$$

If one defines:

$$S_i = \alpha_i |\phi_i M|^2 \qquad (7)$$

It then becomes evident that the SPIF value at (x,y) must solely depend on the values of $S_1, S_2, \ldots, S_N$, and equation (1) becomes:

$$SPIF(x,y) = G(S_1, S_2, \ldots, S_N) \qquad (8)$$

Using successive expansion, one has:

$$SPIF(x, y) = G(0, 0, \ldots, 0) + \sum_{i=1}^{i=N} \beta_i S_i + \sum_{i=1}^{i=N} \sum_{j=1}^{j=N} \eta_{ij} S_i S_j + \ldots \qquad (9)$$

If all the $S_i$ terms are zero (i=1, 2, ..., N), SPIF should be zero, and therefore, G(0,0, ..., 0) should be zero. More specifically, when all S terms equal zero, SPIF=G(0,0,0, ...) from (9). However, only when a mask is completely dark can all S terms equal to zero. In this case, SPIF is obviously equal to zero. As such, equation (10) can be obtained from equation (9). Equation (10) expresses how SPIF (x,y) is related to the signals Si at (x,y).

$$SPIF(x, y) = \sum_{i=1}^{i=N} \beta_i S_i + \sum_{i=1}^{i=N} \sum_{j=1}^{j=N} \eta_{ij} S_i S_j + \ldots \qquad (10)$$

$\{\beta_i\}$ and $\{\eta_{ij}\}$ are the model parameters that characterize the resist response to the signals $\{S_1, S_2, \ldots, S_N\}$. It should be understood that $\{\beta_i\}$ and $\{\eta_{ij}\}$ are independent of the optical imaging setting, as these parameters depend only on the process following the exposure. As such, $\{\beta_i\}$ and $\{\eta_{ij}\}$ can be readily obtained by calibrating the model equation (10) with experimental data.

Utilizing the constant threshold eigen decomposition model described above, it is possible to develop the method that allows for predicting the photolithography performance for exposure tools other than the exposure tool utilized to calibrate the model.

More specifically, assuming the exposure tool used for calibrating the model is exposure tool A, and the optimal set of basis functions for exposure tool A is $\{\phi^A_i\}$. Also assuming that exposure tool B's optimal set of basis functions is $\{\phi^B_n\}$. The set of basis functions $\{\phi^B_n\}$ can be different from the set of basis functions $\{\phi^A_i\}$ either due to slight difference in illuminator profile or some difference in aberration characteristics between the two exposure tools. However, because both $\{\phi^B_n\}$ and $\{\phi^A_i\}$ are complete sets of basis functions, and both possess the same bandwidth, each function in $\{\phi^B_n\}$ can be expressed as a linear combination of $\{\phi^A_i\}$. More specifically:

$$\phi^B_n = \sum_{i=1}^{\infty} \chi^n_i \phi^A_i \qquad (11)$$

where:

$$\chi^n_i = \iint \phi^B_n \cdot \phi^{A*}_i \, dx \, dy \qquad (12)$$

In typical applications, only the first M functions in $\{\phi^B_n\}$ and the first N functions in $\{\phi^A_i\}$ are significant in terms of weighting factor. As such, it is only necessary to consider the amplitudes of the projected signals from $\{S^B_n, n=1,2,\ldots M\}$ onto $\{S^A_i, i=1,2, \ldots, N\}$. More specifically:

$$S^B_n = \alpha^B_n |\phi^B_n \otimes M|^2 \qquad (13)$$

-continued $$= \alpha_n^B \left( \sum_{i=1} \chi_i^n \phi_i^A \otimes M \right) \left( \sum_{t=1} \chi_t^n \phi_t^A \otimes M \right)^*$$

$$= \alpha_n^B \sum_{i=1} |\chi_i^n|^2 |\phi_i^A \otimes M|^2 +$$

$$\alpha_n^B \sum_{i \neq t} \chi_i^n (\chi_t^n)^* (\phi_i^A \otimes M)(\phi_t^A \otimes M)^*$$

$$= \frac{\alpha_n^B}{\alpha_i^A} \sum_{i=1} |\chi_i^n|^2 S_i$$

The second term vanishes in equation (13), because of the lack of phase correlation between fields from $(\phi^A_i M)$ and $(\phi^A_t M)^*$ when $i \neq t$, and the time averaged value therefore becomes null. From equation (13), the projected signals in representation of $\{\phi^A_i\}$ are:

$$\sum_{n=1}^{n=M} \frac{\alpha_n^B}{\alpha_i^A} |\chi_i^n|^2 S_i; i = 1, 2, \ldots, N \quad (14)$$

The equivalent SPIF is:

$$SPIF(x, y) = \sum_{i=1}^{i=N} \beta_i \left( \sum_{n=1}^{n=M} \frac{\alpha_n^B}{\alpha_i^A} |\chi_i^n|^2 S_i \right) + \quad (15)$$

$$\sum_{i=1}^{i=N} \sum_{j=1}^{j=N} \eta_{ij} \left( \sum_{n=1}^{n=M} \frac{\alpha_n^B}{\alpha_i^A} |\chi_i^n|^2 S_i \right) \left( \sum_{n=1}^{n=M} \frac{\alpha_n^B}{\alpha_j^A} |\chi_j^n|^2 S_j \right) + \ldots$$

Using the same threshold, the binary images from exposure tool B can be readily obtained from the SPIF expressed in equation (15).

FIG. 1 is a flowchart illustrating the foregoing method for utilizing a model calibrated for a first exposure tool to predict the imaging performance of another exposure tool. Referring to FIG. 1, in the first step of the process, Step 10, the photolithography process to be utilized is defined. Next, in Step 12, a set of kernels (i.e., the model) defining the first exposure tool (i.e., exposure tool A) and the photolithography process is generated. In the given embodiment, as noted above, an eigen decomposition model is utilized.

Thereafter, in Step 14, a plurality of test structures are subjected to an actual imaging process utilizing exposure tool A and the photolithography process utilized to generate the set of kernels. In Step 16, the model is calibrated. This is accomplished by inputting the test structures into the model and then comparing the results of the model to the actual imaging results produced in Step 14. The model is then adjusted until the imaging results produced by the model match the actual imaging results within a predetermined error tolerance. As would be known by those of skill in the art, the predetermined error tolerance will vary in accordance with the specific application and photolithography tools being utilized. Once the model is tuned so as to be within the predefined error tolerance, the model is deemed calibrated.

Next, in Step 18, a set of kernels (i.e., the second model) defining the second exposure tool (i.e., exposure tool B) and the photolithography process is generated. It is noted that the illuminator profile and aberration of exposure tool B are considered when generating the kernels defining exposure tool B, as these are the dominant factors with regard to variations in performance between the two exposure tools. Of course, however, other factors can be considered, such as, but not limited to focus settings. It is noted that it is possible to measure the illuminator and aberration associated with exposure tool B in order to determine the values of these factors prior to generating the set of kernels associated with exposure tool B. This can be accomplished, for example, by using a metrology tool on the scanners/steppers.

In the next step, Step S20, the set of kernels for exposure tool B generated in Step S18 are expressed as a linear combination of the set of kernels for exposure tool A and an equivalent SPIF function is generated in accordance with equations 14 and 15. In other words, the aerial images from exposure tool B can be represented using its own characteristic kernels, however, the response of the resist to such signal representation is unknown. The resist response is known only when signals are represented in exposure tool A's characteristic kernels, because a process or model calibration has been performed for exposure tool A. It is this reason that the signals from exposure tool B need to be converted into signals that are represented in exposure tool A's kernels. Next, in Step S22, the SPIF function generated in Step S20 can be utilized to generate binary images corresponding to the imaging results that would be produced by exposure tool B, if exposure tool B where utilized to image a mask pattern.

Thus, the present invention allows a first model calibrated in conjunction with a first exposure tool to be utilized to generate a second model for simulating the imaging performance of a second exposure tool, without having to perform a calibration process on the second model.

In addition to the allowing photolithography printing performance prediction on exposure tools that are not calibrated in the manner discussed above, the present invention also provides a method for minimizing the mismatch between different exposure tools which are being utilized to perform the same photolithography process. The minimization of mismatch between exposure tools has become an ever increasing problem and pressing issue in low k1 photolithography, particularly for those technologies in which mask data corrections are required using a calibrated photolithography model. The minimization of mismatch between exposure tools can both reduce the effective cost of masks and increase the productivity significantly. It is noted that exposure tool mismatch results dominantly from variations in the illuminator profiles and aberrations between the different exposure tools. As long as the predominate basis for variations in exposure tool performance can be diagnosed and determined, for example, such as aberrations, the present invention provides a method for reducing such variations.

Figure 2:
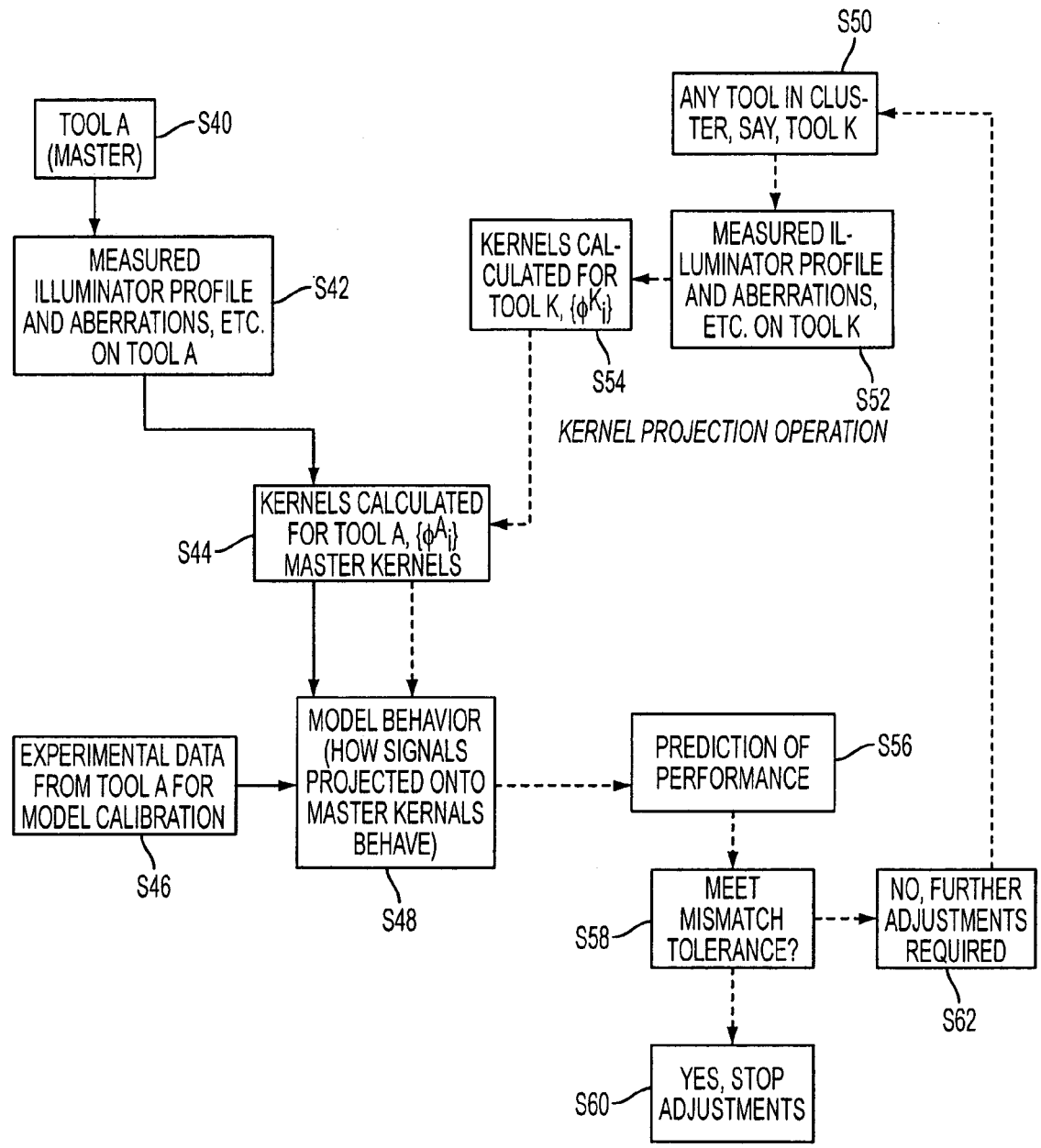
FIG. 2 illustrates an exemplary process for minimizing the mismatch between exposure tools being utilized to implement the same photolithography process.

FIG. 2 illustrates an exemplary process for minimizing the mismatch between exposure tools being utilized to implement the same process in accordance with the present invention. The following example assumes that there are a cluster of exposure tools of the same class, $\{A, B, C, \ldots\}$, and that exposure tool A is the master tool on which a particular photolithography process has been calibrated and a photolithography model has been developed. The first step, S40, is to identify the master tool, which in this example, is exposure tool A. The next step, S42, is to measure the dominant factors on exposure tool A, which contribute to variations in imaging performance between the tools. These factors include, but are not limited to, the illuminator profile and aberrations. Thereafter, in Step S44, a set of kernels (i.e., the model) defining exposure tool A and the photolithography process is generated. In the given embodiment, as discussed above, an eigen decomposition model is utilized. In Step S46, a plurality of test structures are subjected to an actual imaging process utilizing exposure tool A and the selected photolithography process to obtain actual imaging results. Then, in Step S48, the imaging results generated by the model produced in Step S44 are compared to the actual imaging results produced in Step S46, and the results of the comparison are utilized to generate a database indicating the difference between the model performance of exposure tool A and the actual performance of exposure tool A. Then, by adjusting the parameters, for example, $\{\beta^4 i\}$ of equation (9), the error between the modeled results and the experiments can be minimized. This step, Step 48, is basically the model calibration process for exposure tool A.

As explained below, only the model defined by $\{\beta^4 i\}$ will be utilized in predicting the imaging performance on other exposure tools. It is noted that the experimental results from exposure tool A are only utilized in calibrating the model for exposure tool A. After the model on exposure tool A is calibrated, the experimental results from exposure tool A are no longer required. It is noted that this portion of the process is similar to that described above in conjunction with FIG. 1.

The next step, Step S50, is to select one of the other exposure tools, for example, exposure tool B, and measure the same dominant factors for exposure tool B, Step 52, that were measured for exposure tool A in Step S42. Then, in the same manner as Step S44, a set of kernels (i.e., the model) defining exposure tool B and the photolithography process is generated, Step S54. In the given embodiment, as noted above, an eigen decomposition model is utilized.

Next, returning to step, S44, the set of kernels for exposure tool B generated in Step S54 are expressed as a linear combination of the set of kernels for exposure tool A. Thereafter, returning to Step 48, the imaging performance for exposure tool B is determined utilizing the SPIF function of equation 15 for any structures, including but not limited to the test structures utilized in Step S46 to generate actual imaging results.

Once the imaging results for exposure tool B are determined, in Step 56, these results are compared to imaging results generated by the model for exposure tool A to determine the differences in imaging performance between the exposure tools. If the difference between the imaging performance (i.e., mismatch) of exposure tool A and exposure tool B is within a predetermined error tolerance, Step 58, the process is completed, Step 60, and exposure tool B is deemed capable of imaging the desired target mask pattern.

However, if the difference in imaging results is not within the predefined error tolerance, the process proceeds to Step 62, in which adjustments are made to the exposure tool in an effort to minimize the variations or mismatch in the imaging performance between exposure tool B and the master exposure tool A. For example, the engineer or operator can adjust the optical elements on the machine to modify the illuminator profiles or aberration characteristics. Once the adjustments are made, Steps S52, S54, S44, S48, S56 and S58 are repeated to confirm that the adjusted exposure tool is within the predefined error tolerance.

Figure 3:
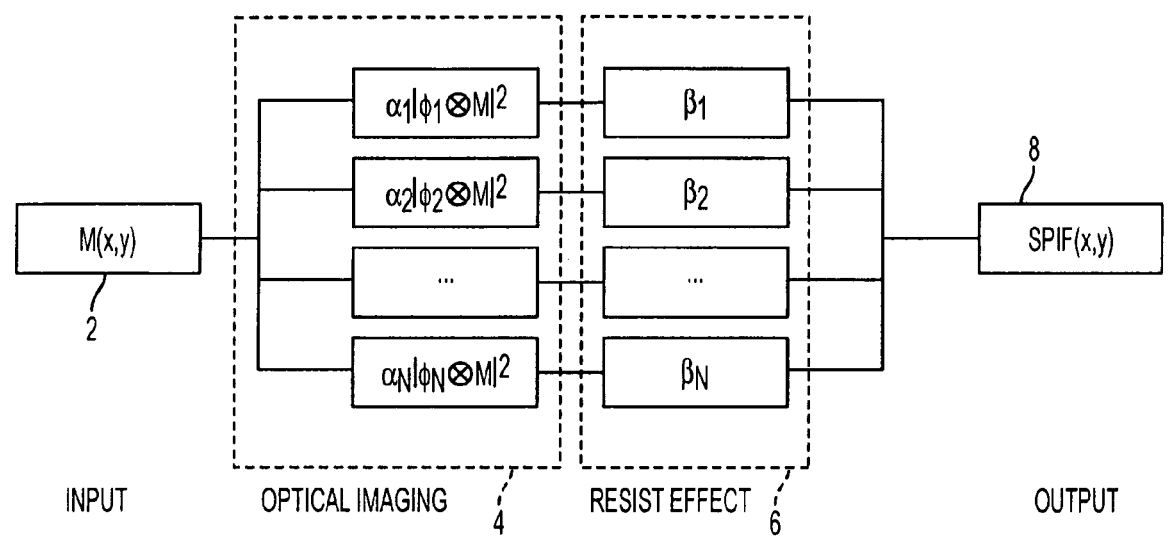
FIG. 3 illustrates an exemplary eigen decomposition model (e.g., a first order eigen decomposition model).
Figure 4:
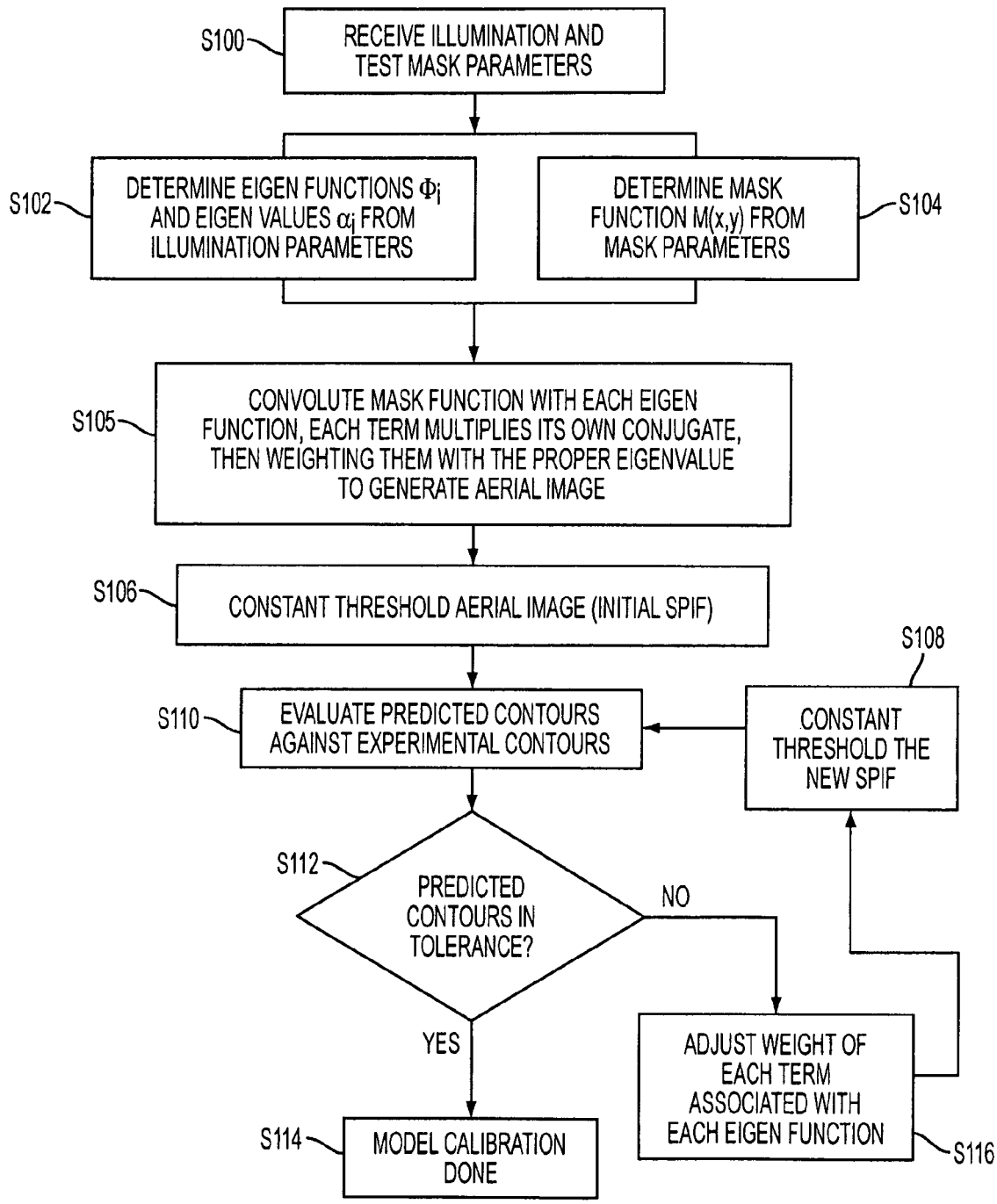
FIG. 4 illustrates an exemplary process for generating a calibrated eigen decomposition model.

FIGS. 3 and 4 illustrate a more detailed explanation of the model calibration process referred to in FIG. 1. Referring to FIGS. 3 and 4, an input 2 containing characteristics of the mask pattern is provided to an optical imaging model 4, step S100. Eigen functions and eigen values representing the imaging process are determined from characteristics of the illumination source and imaging process to be utilized including, for example, the numerical aperture NA and the wavelength $\lambda$, step S102. The characteristics of test mask (i.e., the test structures) are used to determine a mask function $M(x,y)$, step S104, which is provided as input 2. The aerial image is determined by convoluting the eigen functions with the mask function $M(x,y)$, step S105. A first order eigen function indicative of the resist effect 6 may be utilized in determining the aerial image to account for the effect a particular resist has on the actual aerial image. A predetermined constant threshold is applied to the aerial image to generate an initial SPIF with predicted contours, step S106. The predicted contours are compared to known contours of the test mask, which are determined by actually printing the test mask image using the same illumination conditions and process, step S110. If the predicted contours are within a predetermined error tolerance of the measured contours, step S112 YES (it is noted that in the preferred embodiment, 2-dimensional counters are utilized in the comparison process), then the predictive model is certified as being an accurate model and the model calibration is complete, step S114. If the predicted contours are not within a predetermined error tolerance, step S112 NO, then the weight of each term associated with each eigen function, which define the imaging process, is adjusted, step S116 and a new SPIF is produced. Then, a the constant threshold is applied to the new SPIF, step S108, and the process in steps S108–116 is repeated until a model is produced which provides contours within the predetermined error tolerance.

Figure 5:
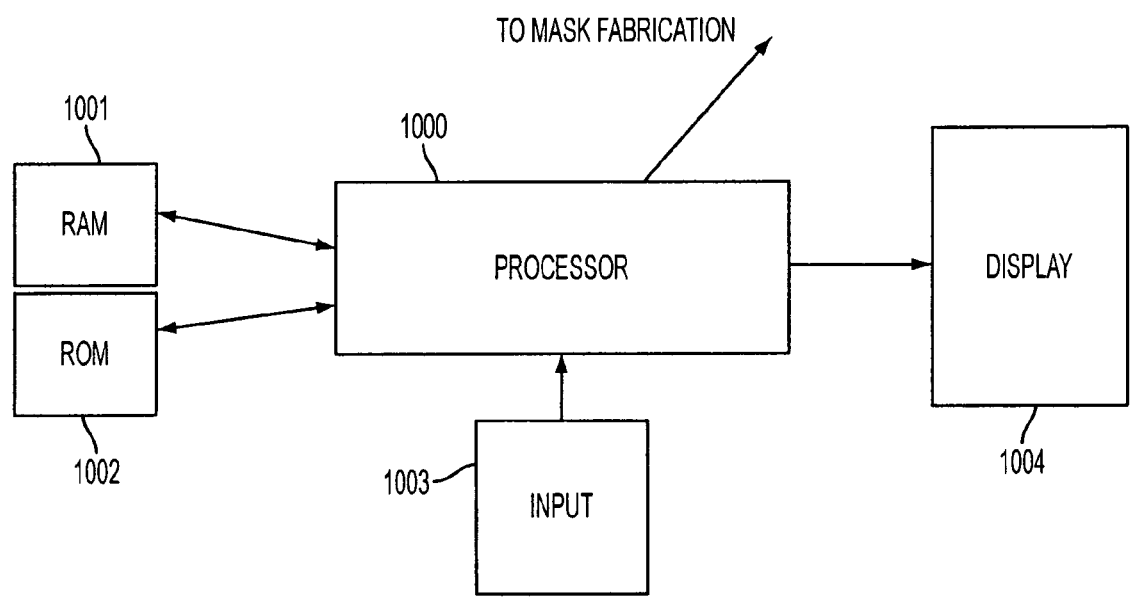
FIG. 5 illustrates an exemplary processing system for implementing the present invention.

FIG. 5 illustrates an exemplary processing system for implementing the eigen decomposition models illustrated in FIGS. 1–4. As illustrated in FIG. 5, an exemplary mask optimization unit may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the processing illustrated in FIGS. 1–4, and stores information on RAM 1001. The calculated results of processor 1000 may be displayed on display 1004 and may be provided to a mask fabrication unit.

Figure 6:
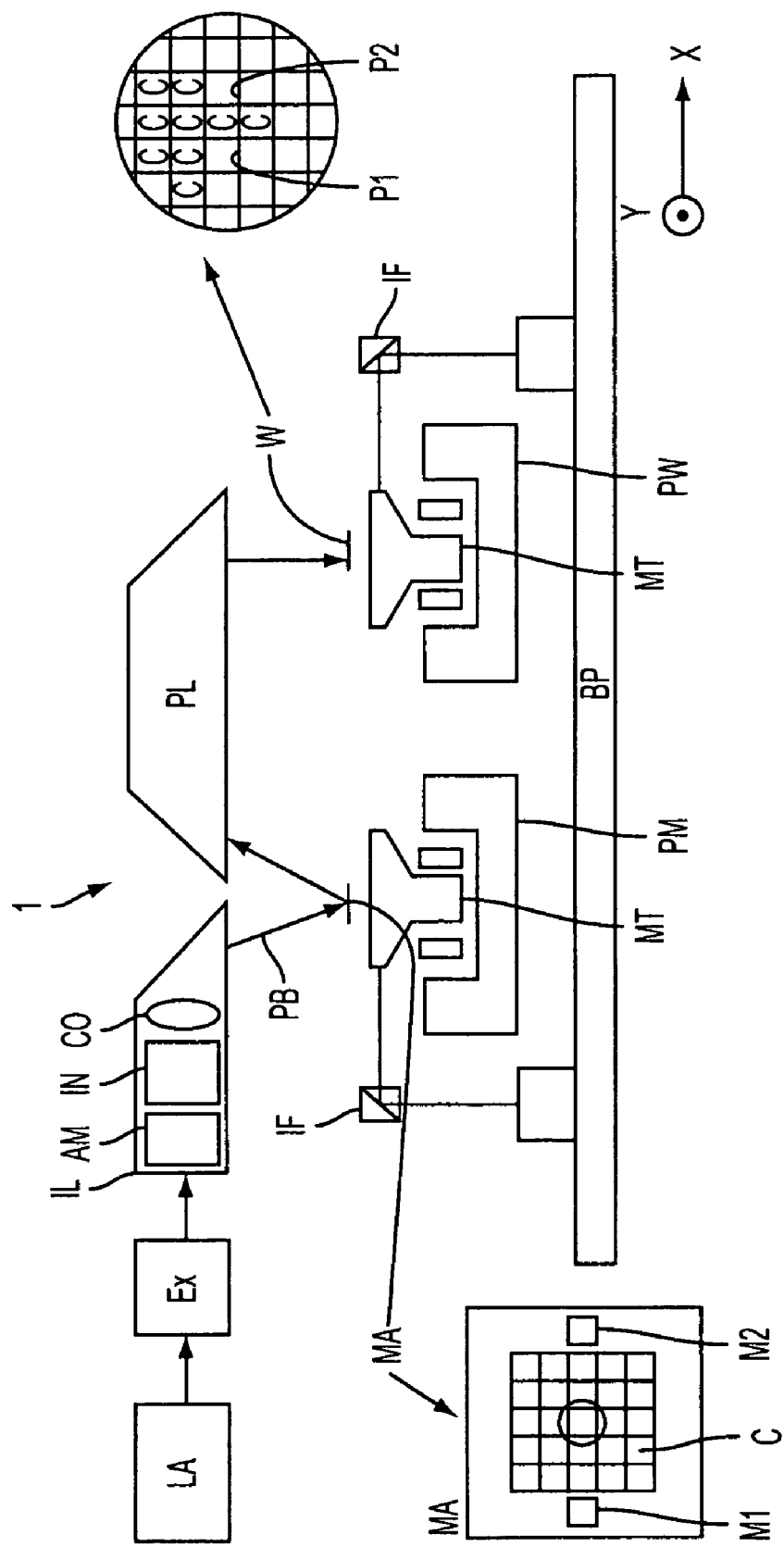
FIG. 6 schematically depicts a lithographic projection apparatus suitable for use with a mask designed with the aid of the current invention.

FIG. 6 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 6 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 6. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20–5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of the processor 1000 involve programming, including executable code, are used to implement the above described method of determining optimal DOE for different lithography systems. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

It is also noted that variations of the foregoing embodiments of the present invention are also possible. As already mentioned, while the embodiments disclosed above illustrate the present invention being utilized in conjunction with an eigen decomposition model, it can also be utilized with other types of model simulators.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for generating models for simulating the imaging performance of a plurality of exposure tools, said method comprising the steps of:
   generating a calibrated model for a first exposure tool, said calibrated model capable of estimating an image to be produced by said first exposure tool for a given photolithography process, said calibrated model comprising a first set of basis functions;
   generating a model of a second exposure tool, said model capable of estimating an image to be produced by said second exposure tool for said photolithography process, said model comprising a second set of basis functions; and
   representing said second set of basis functions as a linear combination of said first set of basis functions so as to generate an equivalent model function corresponding to said second exposure tool,
   wherein said equivalent model function produces a simulated image corresponding to the image generated by said second exposure tool for said photolithography process.

2. The method of claim 1, wherein said calibrated model is generated by:
   defining parameters of said first exposure tool and processing conditions to be utilized in said photolithography process;
   generating an initial model of said first exposure tool;
   defining a plurality of test structures;
   imaging the test structures utilizing said first exposure tool and processing conditions of said photolithography process to obtain actual imaging results;
   generating simulated imaging results by subjecting said test structures to said initial model;
   comparing said simulated imaging results to said actual imaging results; and
   adjusting said initial model such that the difference between said simulated imaging results and said actual imaging results is less than a predefined criteria,
   wherein said adjusted initial model corresponds to said calibrated model.

3. The method of claim 1, wherein said first set of basis functions and said second set of basis functions comprise a plurality of eigen functions.

4. The method of claim 1, wherein there is no calibration process performed on said second exposure tool.

5. The method of claim 2, wherein said comparing said simulated imaging results to said actual imaging results utilizes two-dimensional contour patterns in the comparison process.

6. A computer readable medium having stored thereon a computer program having executable code, wherein execution of the code by at least one programmable computer causes the at least one programmable computer to perform a sequence of steps for generating models for simulating the imaging performance of a plurality of exposure tools, said sequence of steps comprising:
   generating a calibrated model for a first exposure tool, said calibrated model capable of estimating an image to be produced by said first exposure tool for a given photolithography process, said calibrated model comprising a first set of basis functions;
   generating a model of a second exposure tool, said model capable of estimating an image to be produced by said second exposure tool for said photolithography process, said model comprising a second set of basis functions; and
   representing said second set of basis functions as a linear combination of said first set of basis functions so as to generate an equivalent model function corresponding to said second exposure tool,
   wherein said equivalent model function produces a simulated image corresponding to the image generated by said second exposure tool for said photolithography process.

7. The computer readable medium of claim 6, wherein said step of generating said calibrated model comprises the steps of:
   defining parameters of said first exposure tool and processing conditions to be utilized in said photolithography process;
   generating an initial model of said first exposure tool;
   defining a plurality of test structures;
   imaging the test structures utilizing said first exposure tool and processing conditions of said photolithography process to obtain actual imaging results;
   generating simulated imaging results by subjecting said test structures to said initial model;
   comparing said simulated imaging results to said actual imaging results; and
   adjusting said initial model such that the difference between said simulated imaging results and said actual imaging results is less than a predefined criteria,
   wherein said adjusted initial model corresponds to said calibrated model.

8. The computer readable medium of claim 6, wherein said first set of basis functions and said second set of basis functions comprise a plurality of eigen functions.

9. The computer readable medium of claim 6, wherein there is no calibration process performed on said second exposure tool.

10. The computer readable medium of claim 7, wherein said comparing said simulated imaging results to said actual imaging results utilizes two-dimensional contour patterns in the comparison process.

11. An apparatus for generating models for simulating the imaging performance of a plurality of exposure tools, said apparatus comprising:
   means for generating a calibrated model for a first exposure tool, said calibrated model capable of estimating an image to be produced by said first exposure tool for a given photolithography process, said calibrated model comprising a first set of basis functions;
   means for generating a model of a second exposure tool, said model capable of estimating an image to be produced by said second exposure tool for said photolithography process, said model comprising a second set of basis functions; and means for representing said second set of basis functions as a linear combination of said first set of basis functions so as to generate an equivalent model function corresponding to said second exposure tool, wherein said equivalent model function produces a simulated image corresponding to the image generated by said second exposure tool for said photolithography process.

12. The apparatus of claim 11, wherein said means for generating said calibrated model comprises:

means for defining parameters of said first exposure tool and processing conditions to be utilized in said photolithography process;

means for generating an initial model of said first exposure tool;

means for defining a plurality of test structures;

means for imaging the test structures utilizing said first exposure tool and processing conditions of said photolithography process to obtain actual imaging results;

means for generating simulated imaging results by subjecting said test structures to said initial model;

means for comparing said simulated imaging results to said actual imaging results; and means for adjusting said initial model such that the difference between said simulated imaging results and said actual imaging results is less than a predefined criteria, wherein said adjusted initial model corresponds to said calibrated model.

13. The apparatus of claim 11, wherein said first set of basis functions and said second set of basis functions comprise a plurality of eigen functions.

14. The apparatus of claim 11, wherein there is no calibration process performed on said second exposure tool.

15. The apparatus of claim 12, wherein said comparing said simulated imaging results to said actual imaging results utilizes two-dimensional contour patterns in the comparison process.

* * * * *